United States Patent
Pelletier et al.

(10) Patent No.: US 9,655,279 B2
(45) Date of Patent: May 16, 2017

(54) APPARATUS AND METHODS FOR COOLING A CPU USING A LIQUID BATH

(71) Applicants: Marc-Antoine Pelletier, Georgeville (CA); Irené Normandin, Sherbrooke (CA); Simon Jasmin, Montréal (CA)

(72) Inventors: Marc-Antoine Pelletier, Georgeville (CA); Irené Normandin, Sherbrooke (CA); Simon Jasmin, Montréal (CA)

(73) Assignee: SYSTEMEX-ENERGIES INTERNATIONAL INC., St. Michael (BB)

( * ) Notice: Subject to any disclaimer, the term of this patent is extended or adjusted under 35 U.S.C. 154(b) by 0 days.

(21) Appl. No.: 14/428,269

(22) PCT Filed: Sep. 13, 2013

(86) PCT No.: PCT/CA2013/000821
§ 371 (c)(1),
(2) Date: Mar. 13, 2015

(87) PCT Pub. No.: WO2014/040182
PCT Pub. Date: Mar. 20, 2014

(65) Prior Publication Data
US 2015/0245539 A1    Aug. 27, 2015

Related U.S. Application Data

(60) Provisional application No. 61/701,409, filed on Sep. 14, 2012.

(51) Int. Cl.
*H05K 7/20* (2006.01)
*G06F 1/20* (2006.01)
(Continued)

(52) U.S. Cl.
CPC ......... *H05K 7/20236* (2013.01); *G06F 1/206* (2013.01); *H01L 23/427* (2013.01);
(Continued)

(58) Field of Classification Search
CPC . G06F 1/181–1/182; H05K 7/20218–7/20381;
(Continued)

(56) References Cited

U.S. PATENT DOCUMENTS 8,009,419 B2    8/2011    Attlesey et al.
2003/0214783 A1*    11/2003    Narakino ............... F28D 1/0308
361/679.53
(Continued)

FOREIGN PATENT DOCUMENTS

WO    2007137019 A2    11/2007

OTHER PUBLICATIONS

Jan. 13, 2014—(CA) International Search Report—App 2013000821.
Jan. 13, 2014—(CA) Written Opinion of the International Searching Authority—App 2013000821.

*Primary Examiner* — Anthony Haughton
*Assistant Examiner* — Razmeen Gafur
(74) *Attorney, Agent, or Firm* — Banner & Witcoff, Ltd.

(57) ABSTRACT

A system for cooling a CPU. The system has a tank for holding dielectric coolant in a liquid phase. The CPU is immersed in the coolant. A cover closes the tank. Electric pathways that convey data to/from the CPU traverse the cover. The electric pathways allow the CPU to exchange data with an external device. In this fashion, the CPU can perform data processing functions while being immersed in dielectric coolant.

19 Claims, 9 Drawing Sheets

(51) Int. Cl.
  *H01L 23/427* (2006.01)
  *H01L 23/44* (2006.01)
  *H01L 23/473* (2006.01)

(52) U.S. Cl.
  CPC ......... *H01L 23/44* (2013.01); *H05K 7/20272* (2013.01); *H01L 2924/0002* (2013.01)

(58) Field of Classification Search
  CPC ............ H05K 7/20409–7/20418; H05K 7/20009–7/202; H01L 23/367–23/3677; H01L 23/473; H01L 23/46–23/467
  USPC ...... 361/676–678, 679.46–679.54, 688–723, 361/756, 741, 686, 687, 725, 787, 789, 361/794, 807–810; 165/80.1–80.5, 165/104.33, 185; 174/15.1–15.3, 174/16.1–16.3, 547, 548; 257/712–722, 257/E23.088; 24/453, 458–459; 348/787, 789, 794; 349/58–60
  See application file for complete search history.

(56) References Cited

U.S. PATENT DOCUMENTS

| | | | | |
|---|---|---|---|---|
| 2004/0182544 A1* | 9/2004 | Lee | ............... | H01L 23/473 165/80.4 |
| 2005/0141196 A1* | 6/2005 | Yamatani | ............... | G06F 1/20 361/699 |
| 2006/0067052 A1* | 3/2006 | Llapitan | ............... | F28D 1/05375 361/700 |
| 2006/0187638 A1* | 8/2006 | Vinson | ............... | G06F 1/20 361/698 |
| 2007/0070600 A1* | 3/2007 | Tomioka | ............... | F28D 15/0266 361/688 |
| 2008/0179041 A1* | 7/2008 | Hu | ............... | F28D 1/05375 165/71 |
| 2008/0264604 A1* | 10/2008 | Campbell | ............... | F28F 3/02 165/80.4 |
| 2008/0266798 A1* | 10/2008 | Eckberg | ............... | H05K 7/20272 361/699 |
| 2008/0314565 A1* | 12/2008 | Martin | ............... | H01L 23/427 165/104.33 |
| 2009/0052136 A1* | 2/2009 | Chung | ............... | H01L 23/473 361/702 |
| 2009/0090489 A1* | 4/2009 | Chiang | ............... | H01L 23/473 165/104.33 |
| 2009/0161301 A1* | 6/2009 | Woody | ............... | H05K 7/209 361/678 |
| 2009/0234705 A1* | 9/2009 | Brunschwiler | ............... | G06F 1/206 62/259.2 |
| 2009/0284911 A1* | 11/2009 | Morehead | ............... | G06F 1/20 361/679.47 |
| 2010/0061058 A1* | 3/2010 | Tanabe | ............... | B62K 11/04 361/690 |
| 2010/0118494 A1* | 5/2010 | Campbell | ............... | H05K 7/20772 361/701 |
| 2010/0296248 A1* | 11/2010 | Campbell | ............... | H05K 7/20218 361/699 |
| 2011/0043999 A1* | 2/2011 | Johnston | ............... | B03C 3/68 361/699 |
| 2011/0044001 A1* | 2/2011 | Olesen | ............... | H01L 23/473 361/703 |
| 2011/0075353 A1* | 3/2011 | Attlesey | ............... | G06F 1/20 361/679.47 |
| 2011/0075373 A1* | 3/2011 | Campbell | ............... | H05K 7/202 361/701 |
| 2011/0134604 A1* | 6/2011 | Attlesey | ............... | G06F 1/20 361/679.47 |
| 2011/0317367 A1* | 12/2011 | Campbell | ............... | H05K 7/20809 361/700 |
| 2014/0218859 A1* | 8/2014 | Shelnutt | ............... | G06F 1/206 361/679.46 |

* cited by examiner

APPARATUS AND METHODS FOR COOLING A CPU USING A LIQUID BATH

CROSS-REFERENCE TO RELATED APPLICATIONS

The present application is a U.S. National Phase filing of International Application No. PCT/CA2013/000821, filed on Sep. 13, 2013, designating the United States of America and claiming priority to U.S. Provisional Patent Application No. 61/701,409 filed Sep. 14, 2012. The present application claims priority to and the benefit of all the above-identified applications, which are all incorporated by reference herein in their entireties.

FIELD OF THE INVENTION

The invention relates to a system for cooling an electronic data processor such as the CPU by immersion in a liquid bath. Specifically, the invention relates to the structure of the cooling system and to methodologies for controlling the cooling system to adequately cool the CPU.

BACKGROUND OF THE INVENTION

Electronic data processing devices such as servers that are commonly available today cool the central processing unit (CPU) by using forced air circulation. This method of cooling is satisfactory when the power consumption of the CPU is comparatively low. However, it becomes a limiting factor when the power consumption of the CPU significantly increases. Since the data-processing capability of the CPU is directly tied to its electric power consumption, the ability to adequately cool the CPU is an important design requirement.

With the expectation that the data processing capacity of CPUs will significantly increase over time, it is plain that novel cooling techniques are required in order to enable the devices to operate within their thermal limits.

SUMMARY OF THE INVENTION

In a first broad aspect, the invention relates to a system for cooling a CPU, comprising a tank for holding dielectric coolant in a liquid phase and for receiving the CPU that is immersed in the coolant, a cover for closing the tank and an electric pathway through the cover for communicating data signals to the CPU.

In a second broad aspect the invention provides a method for cooling a CPU, the method including immersing the CPU in a bath of liquid coolant and varying an immersion depth of the CPU in the liquid coolant with varying cooling requirements of the CPU.

In a third broad aspect, the invention provides a method for cooling a CPU, the method including immersing the CPU in a bath of liquid coolant contained in a tank and varying a vapor pressure of coolant in the tank with varying cooling requirements of the CPU.

In a fourth broad aspect, the invention provides a method for cooling a CPU, the method including immersing the CPU in a bath of liquid coolant contained in an enclosed vessel having a wall and passing data via electric signals through the wall to the CPU for processing.

In a fifth broad aspect, the invention provides a method for cooling a CPU having a heat transfer surface, the method including immersing the CPU in a bath of liquid coolant and perturbing coolant bubbles at the heat transfer surface to induce the bubbles to detach from the surface.

EXAMPLE OF IMPLEMENTATION OF THE INVENTION

An example implementation of the invention is illustrated in the annexed drawings. With specific reference to FIG. 1, the invention provides a cooling system for an electronic component that uses an electronic device, including a CPU. The cooling is performed by immersion of the CPU in a liquid coolant. The liquid coolant is dielectric to avoid short-circuiting the electrical connections between the CPU and the associated electronic components. Examples of suitable dielectric cooling liquids will be provided later.

The cooling system generally operates according to different heat absorption modes. For example, one mode uses conduction to absorb heat that is generated by the CPU. Thus, thermal energy is directed from the CPU to the adjoining liquid, which has the effect of elevating the temperature of the cooling liquid. To prevent the cooling liquid from overheating, it is circulated through a cooling loop.

Another heat absorption mode uses phase change to take up thermal energy from the electronic device. When the temperature of the electronic device exceeds the boiling point of the cooling liquid, it will cause the liquid to evaporate. As the vapor is cooled, it condensates and returns to the main cooling chamber for another evaporation cycle.

The system can be operated in either of the aforementioned modes or in a combination thereof depending on the cooling requirements.

Figure 1:
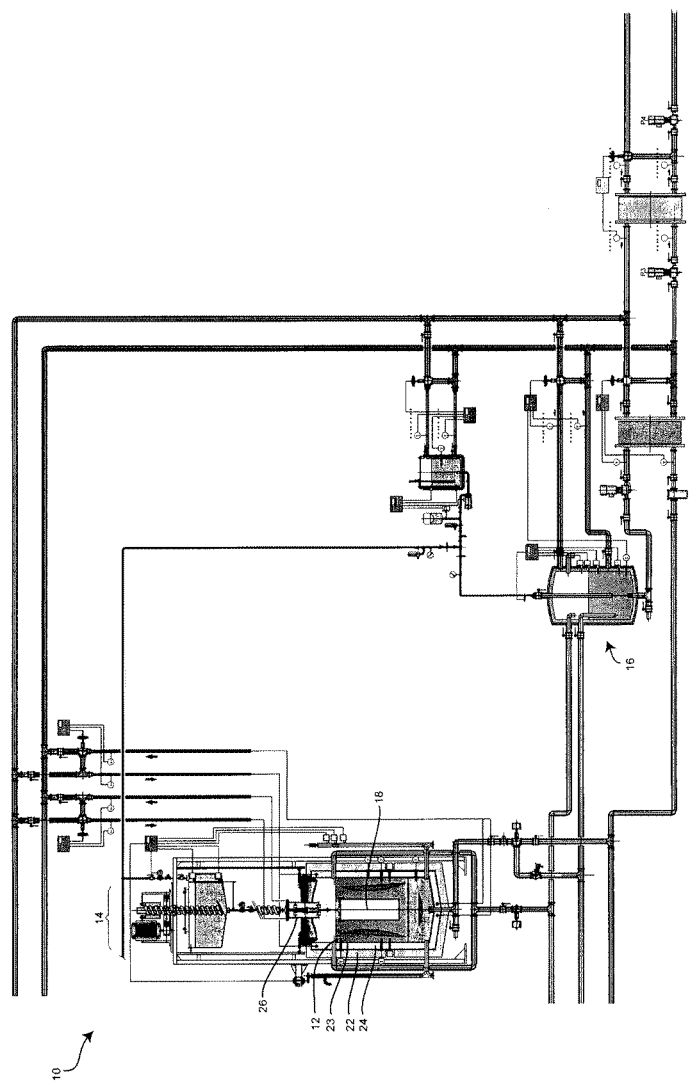
FIG. 1 is a diagram of the electronic module cooling system according to an example implementation of the invention.

The cooling system is generally designated by the reference 10 in FIG. 1. The cooling system 10 includes a main cooling chamber 12 in which the CPU and the associated electronic circuitry are immersed in cooling liquid. The cooling system 10 further includes a lifting mechanism 14 for raising the lid of the cooling chamber and also electronic module being cooled. Finally, the cooling system 10 includes a buffer tank section 16 for the cooling liquid.

Figure 2:
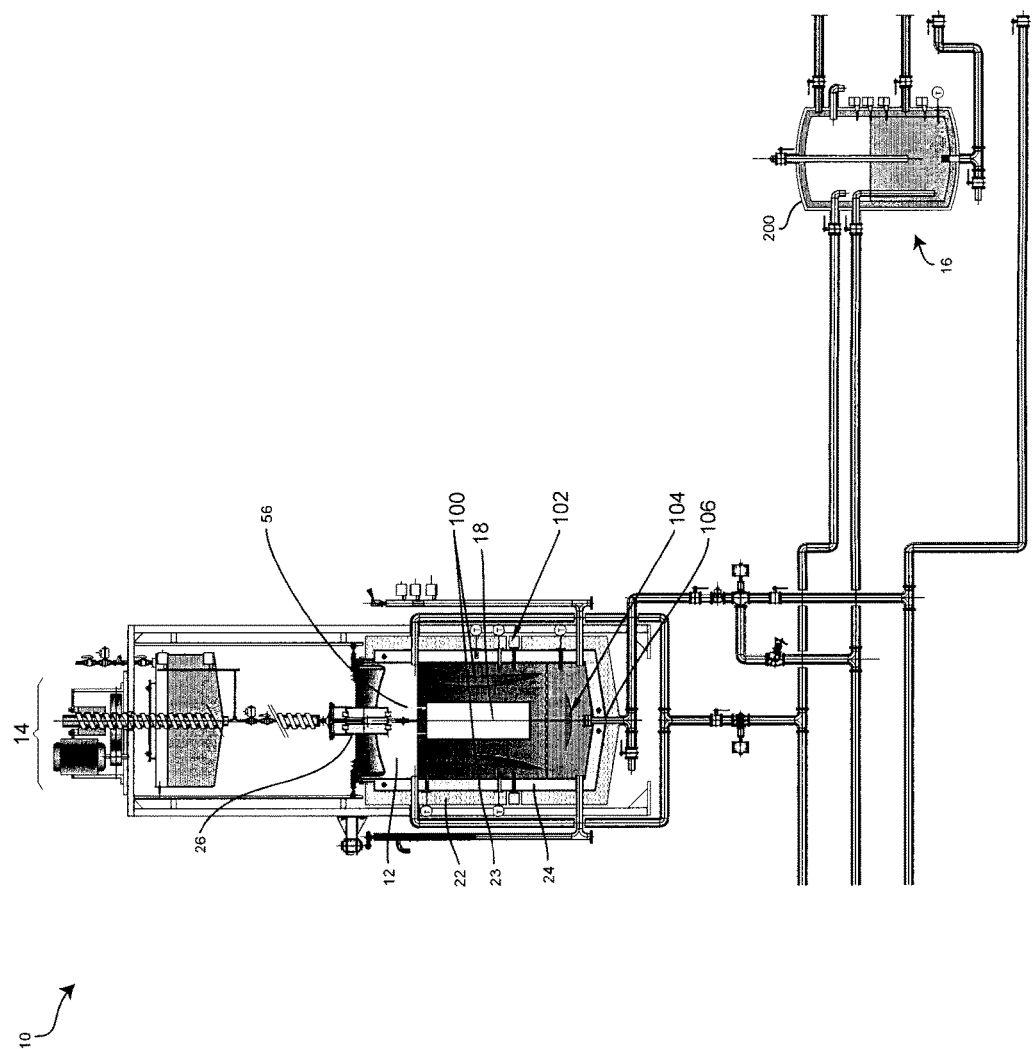
FIG. 2 is an enlarged view of the main cooling chamber of the system shown in FIG. 1 also illustrating a buffer tank for the primary cooling liquid.

The structure of the main cooling chamber 12 is best shown in FIG. 2. The main cooling chamber 12 is essentially a vessel designed to hold a predetermined quantity of cooling liquid and it is dimensioned in order to receive the electronic module 18 to be cooled. The electronic module 18 includes the CPU, which typically would be the main heat generation component of the module. A data server is an example of such electronic module 18.

The vessel can be made of any suitable material but it is preferred to use a metallic component in order to isolate the electronic module 18 from external electromagnetic interferences. In a possible variant, the vessel can be made of a composite material and a suitable electromagnetic shielding, such as copper meshing can be applied on it. The material of the vessel itself or the shielding material is electrically connected to ground during installation.

The vessel includes an outer thermal insulation layer 22 to prevent or at least reduce thermal exchange between the cooling system 10 and the external environment. This insulation layer 22 prevents a cooling loop in the main cooling chamber 12 to absorb external heat, which will make it less effective in cooling the cooling liquid in the main cooling chamber 12. The thermal insulation layer 22 may include a layer of polymeric foam or any other suitable material having the desired insulation properties.

The main cooling chamber 12 includes an internal frame 23, outside of which is provided a cooling jacket 24. The frame 23 is used to support elements surrounding the main cooling chamber 12 (such as level controls, ultrasonic equipment, conduits, etc.). The jacket 24 is an area in which secondary coolant can flow to cool the primary coolant in the main cooling chamber 12 and that is in direct contact with the CPU. The jacket 24 can be designed as a void volume that is filled with secondary coolant. The flow of secondary coolant in that space allows removing heat from the primary coolant via thermal transfer through the internal frame 23. For that reason, the material of the internal frame 23 should be selected to facilitate heat transfer. Metallic material is preferred.

Wrapping the main cooling chamber 12 with a conduit in which secondary coolant flows can also form the jacket 24. For instance, the conduit, which can be made from copper or other metallic material, is coiled around the frame 23. The conduit can be brazed to the frame 23 to enhance heat transfer.

The jacket 24 has a secondary coolant inlet and a secondary coolant outlet. The inlet and the outlet can be placed in different positions but is generally preferred to locate them such that they are opposite locations on the main cooling chamber 12 to extend the fluid path between them. In this fashion, the heat take-up ability of the arrangement is enhanced due to increased distance and also due to the coil-like path that the liquid develops as it passes in the jacket.

The main cooling chamber 12 has a lid 26. The lid 26 closes the main cooling chamber 12 to prevent primary coolant from escaping especially when the coolant is in a gaseous phase. The lid 26 also constitutes a support structure for the electronic module 18 and further constitutes a condenser for the primary coolant. Also the lid 26 constitutes an interface for electrical, data and secondary coolant connections.

Figure 4:
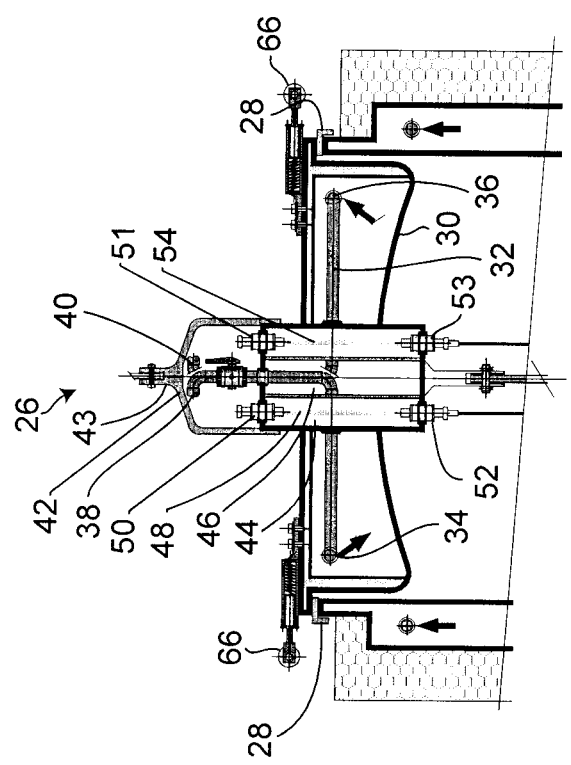
FIG. 4 is an enlarged view of the lid of the cooling chamber and the associated fluid, data and electrical connections.

The structure of the lid 26 is best shown in FIG. 4. It has a general configuration that matches the top portion of the main cooling chamber 12 such that it can partially fit inside. The lid 26 physically rests on the upper edge of the vessel defining the main cooling chamber 12. A suitable gasket 28 is provided to create a fluid tight seal. A gasket made of neoprene is preferred.

The lid 26 has a bottom surface 30 that constitutes a condenser for the gaseous primary coolant that is evaporating and rising up. The bottom surface 30 is thus chilled to condense the primary coolant vapors and it is also configured to induce the condensed droplets to migrate over the chilled surface such as to cool them as much as possible. Specifically, the bottom surface 30 has an incline rather than being perfectly horizontal. In the example shown the incline is toward the outer edge of the condenser and fall into the body of primary coolant close to the wall of the vessel which is cooled by the jacket. As primary coolant vapors condense, they will flow under the effect of gravity toward the outer edge. As they flow, the liquid material will spread over the condenser forming streaks which is likely to increase the heat transfer and further chill the condensate.

Note that in a possible variant, the incline may be oriented differently. Instead of being oriented toward the periphery, the bottom surface 30 may slope toward the center. This variant is expected to function about the same way. Other arrangements are also possible without departing from the spirit of the invention.

The lid 26 has an internal jacket for secondary coolant circulation. The jacket is a fluid path 32 having an inlet 34 and an outlet 36. The inlet 34 and outlet 36 can be located at opposite ends of the lid 26 such that the fluid undergoes helicoidal movement within the lid 26, thereby providing even cooling throughout. The configuration of the jacket is such that it is close to the bottom surface 30 to provide as much cooling as possible.

A secondary coolant feed line 38 connects to the inlet 34 to feed pressurized cooling media, such as water. The warmed up secondary coolant is removed via an outlet 40.

A lift hanger 42 is provided in the central portion of the lid 26 to allow raising and lowering the lid 26. The lift hanger 42 also constitutes a feed through for the passage of secondary coolant, electrical supply and data communication with the electronic module 18. The lift hanger 42 is a generally elongated cylindrical structure that is centrally placed on the lid 26. It has at its top end 43 a projection for connecting to a lifting mechanism that will be described in detail later. Internally, the lift hanger 42 defines an inner peripheral chamber 44 for receiving the electrical and the data connections and a central chamber 46 for receiving the secondary coolant conduit.

The electrical supply cable 48 supplies electrical power to the electronic module 18. The electrical supply cable 48 has a series of pass-through fittings 50, 52 that establish a fluid tight connection preventing the escape of primary coolant vapors through the lift hanger 42. The data connection is configured in a similar fashion with fittings 51, 53. The data connection cable 54 allows the electronic module 18 to exchange data with external components. To reduce the likelihood of data being corrupted as a result of electromagnetic interference, the data connection cable 54 is provided with a suitable shielding.

The lower end of the lift hanger 42 has a yoke 56 from which hangs the electronic module 18. The mechanical connection between the yoke 56 and the electronic module 18 may be made by a steel cable or by any other suitable arrangement, such as a rigid plate.

Referring back to FIG. 1, the cooling system 10 is has a lid lifting mechanism 14 designed to automatically raise the lid 26 to open the main cooling chamber 12. Raising the lid 26 would typically be required when maintenance needs to be performed on the electronic module 18 or on the main cooling chamber 12. When the lid 26 is raised, the electronic module 18 that is suspended from it is removed from the primary coolant bath.

As it will be discussed later, the procedure for lifting the electronic module 18 from the coolant bath can be performed automatically. During the process, the coolant level adjustment mechanism is de-activated. Without such de-activation, the automatic control system will observe a liquid level drop resulting form the removal of the electronic module and will attempt to compensate by commanding valves to flow additional primary coolant in the main cooling chamber. If the level is thus raised, the insertion of the electronic module back in the body of liquid will cause an overflow.

The lid lifting mechanism 14 includes a jackscrew 58 connected to motor 60. When the motor 60 is powered and turns, the jackscrew 58 moves up or down, depending on the direction of rotation. Therefore, the jackscrew 58 acts as a linear actuator. The jackscrew 58 is connected via a rotary coupling to the top end 43 of the lift hanger. As the jackscrew 58 moves up, the lid 26 is raised to open the main cooling chamber 12.

A guiding structure 62 is provided to guide the vertical movement of the lid 26. The guiding structure 62 includes a pair of horizontally spaced apart vertical rails 64. Spring biased rollers 66, best shown in FIG. 4, mounted on the lid 26 engage the rails 64 and ride on the rails 64 as the lid 26 moves up and down. The rails 64 thus guide the lid movement and prevent it from swinging or otherwise moving horizontally.

Figure 3:
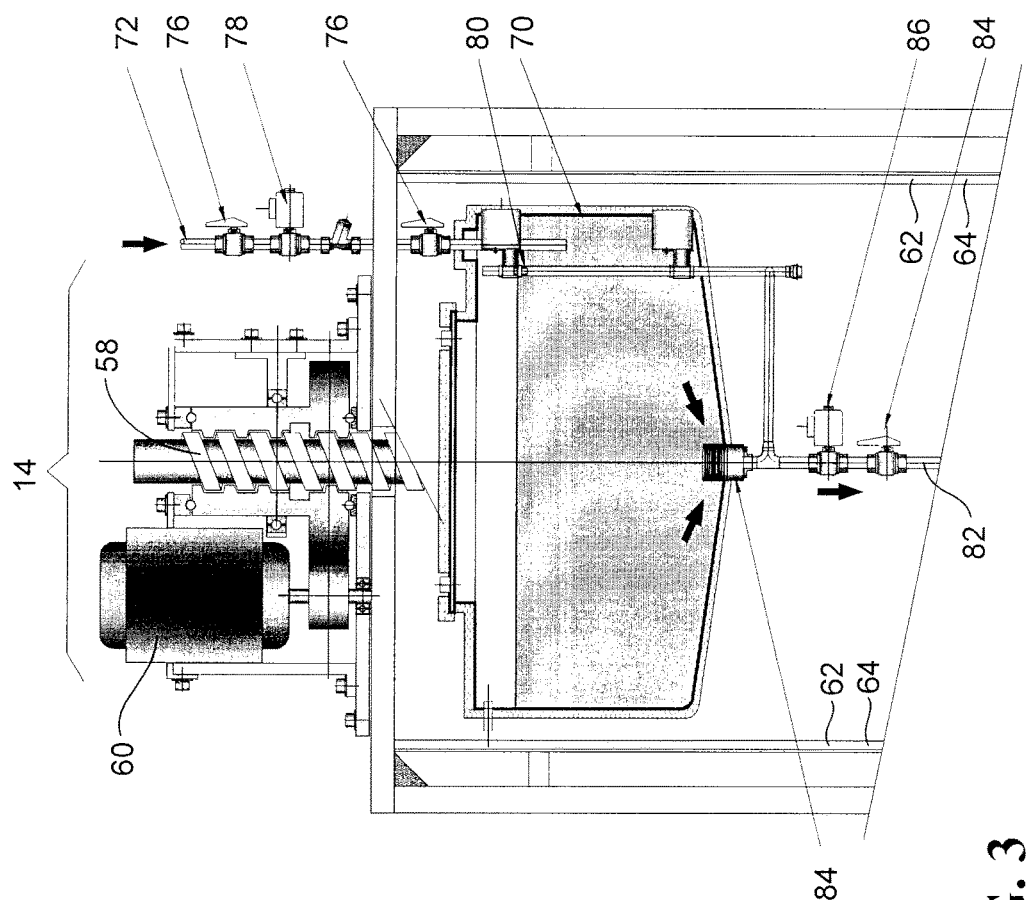
FIG. 3 is an enlarged view of a cooling liquid make-up tank designed for replenishing the main cooling chamber with primary cooling liquid.

Above the lid 26 is provided a primary coolant make-up tank 70, which is illustrated in greater detail at FIG. 3. The primary coolant make-up tank 70 is a source of primary coolant to replenish the primary coolant level in the main cooling chamber 12. Since the main cooling chamber 12 is closed, which prevents loss of primary coolant vapors, the level of primary coolant will not vary much during the operation of the electronic module 18. However, some loss of primary coolant may occur over time and the make-up tank 70 is designed to compensate for that loss.

The make-up tank 70 can also be used to provide an emergency cooling source in the event the level of primary coolant in the main cooling chamber 12 suddenly drops, which may occur as a result of rupture of coolant conduit. If the coolant loss is rapid the CPU in the electronic module 18 may overheat. The make-up tank 70 thus provides an emergency source of coolant that can be directed to the main cooling chamber to provide sufficient cooling medium until the electronic module 18 has been shut down.

The coolant make-up tank 70 is located immediately below the electric motor 60 and it is spaced apart from the lid 26 by a distance sufficient to provide for a sufficient range of movement for the lid 26. By locating the make-up tank 70 above the main cooling chamber 12, coolant can flow by gravity, avoiding the use of a pump. Note that this is not essential to the invention and the make-up tank 70 can be placed in any other suitable location.

The make-up tank 70 has a primary coolant supply line 72 to keep the make-up tank 70 full. A series of valves control the flow of coolant in the line 72 to the make-up tank 70. Specifically, there are manual ball valves 76 and an electric valve 78 which can automatically trigger the replenishment of the make-up tank 70 through the line 72.

The level of primary coolant in the make-up tank 70 is determined by a level sensor 80, which can include floats or any other suitable level sensing device to sense a low coolant level and a high coolant level.

Primary coolant is directed from the make-up tank 70 to the main cooling chamber 12 via a conduit 82. A strainer 84 in the make-up tank 70 filters the coolant to remove impurities. The conduit 82 can deliver the coolant to the main cooling chamber 12 via the lid 26, passing through the lift hanger 42 or through any other suitable location. The conduit 82 may have a portion that is flexible to accommodate the movement of the lid 26. Valves, including a manually operated ball valve 84 and an electric valve 86, control the flow of the coolant in the conduit 82.

Figure 5:
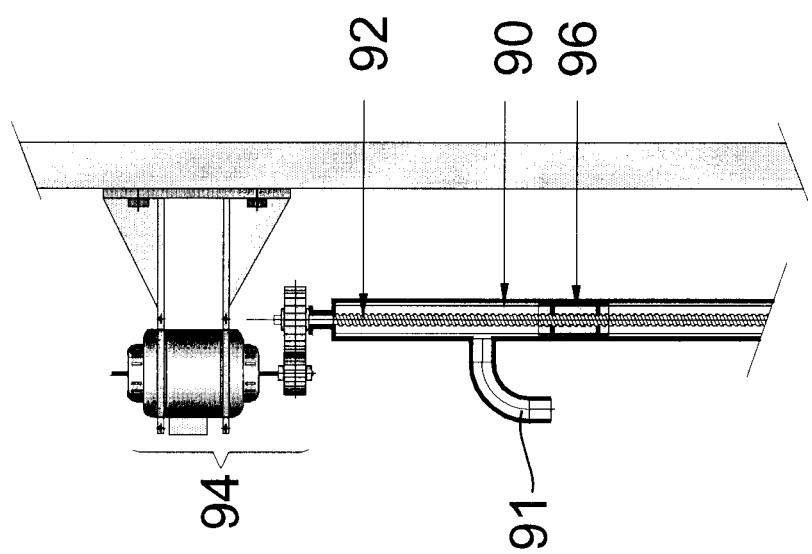
FIG. 5 is yet another enlarged view of a component shown in FIG. 1, which is a piston used to regulate the level of coolant in the main cooling chamber.

FIG. 5 illustrates an arrangement for controlling the level of coolant in the main cooling chamber 12. The level of coolant changes the bubble formation dynamics when the coolant transitions from the liquid phase to the gaseous phase and thus can be used to control how heat is being extracted from the CPU. The example of implementation uses a mechanical arrangement based on a piston that displaces a column of coolant, however other arrangements are possible without departing from the spirit of the invention.

In the example shown, a cylinder 90 is provided beside the main cooling chamber. The cylinder 90 is hollow and it is vertically oriented. The cylinder 90 connects to a piston venting 91 through which the main cooling chamber 12 can be filled with coolant. A jackscrew 92 is placed into the cylinder 90. The jackscrew 92 is driven by an electric motor and gear arrangement 94. A piston 96 is threadedly engaged on the jackscrew 92 such that as the jackscrew 92 rotates, the piston 96 is caused to move up or down, depending on the direction of rotation of the jackscrew 92. In the arrangement shown, the main cooling chamber 12 can be filled by positioning the piston 96 before the piston venting 91. When filling of the main cooling chamber 12 is complete, the piston 96 is moved below the piston venting 91 and can be operated to control the level of coolant in the main cooling chamber 12.

The cylinder 90 is in fluid communication with the main cooling chamber 12. As best shown in FIG. 1, the lower end of the cylinder 90 connects via a short conduit with the bottom end of the main cooling chamber 12. The arrangement is such that the level of coolant in the main cooling chamber 12 and in the cylinder 90 is at the same level, during the normal operation of the cooling device. If the piston 96 is driven downwardly it will displace coolant to the main cooling chamber 12 and force the coolant level in the main cooling chamber 12 to rise.

The further the piston 96 is moved down, the more the level in the main cooling chamber 12 rises.

When the movement of the piston 96 is reversed, the level in the main cooling chamber 12 drops until the level of coolant in the cylinder 90 and the level in the main cooling chamber 12 equalize.

Note that the coolant level control, in addition to regulating the coolant pressure head on the CPU can also be used as a mechanism to regulate the vapor pressure in the main cooling chamber 12. If the main cooling chamber 12 is gas tight and no vapors are allowed to escape, a variation of the coolant level will change the pressure in the main cooling chamber 12. When the level of coolant in the main cooling chamber 12 is raised, the vapor pressure will increase. In turn, this will affect the temperature at which the coolant will boil; the higher the pressure the higher the boiling point.

Also, the piston 96 can be used as an emergency coolant supply to the main cooling chamber 12 should the coolant level in that chamber unexpectedly drop. In such case, the piston is lowered to expel liquid from the cylinder 90 to the main cooling chamber 12. The piston 96 can be actuated in conjunction with the make-up tank 70 to rapidly compensate for a loss of coolant.

As further shown in FIG. 1, the main cooling chamber is provided with a series of bubble flow management devices designed to accelerate the bubble separation from the interface cooling liquid/CPU such as to avoid the thermal insulation effect that the gas pocket in the bubble has if it remains attached to the interface.

The bubble flow management devices includes a baffle designed to create a Venturi effect and accelerate the gaseous flow upwards, hence away from the interface to be cooled. The baffle 100 is essentially a hollow structure in which the electronic module 18 is located. The structure is chimney shaped, and has progressively narrowing cross-sectional configuration in the vertical direction. As the bubble stream is released from the CPU interface, it increases its velocity as flow cross-section diminishes due to the baffle. This has the effect of increasing the velocity of the stream upward and creates suction, thus promoting the flow of fresh liquid coolant toward the CPU interface.

Yet another possible bubble flow management device, which can be used in conjunction with the baffle 100 or independently of the baffle 100, is to provide mechanical agitation to promote bubble separation from the CPU interface. The mechanical agitation disturbs the bubbles and it is believed that it weakens the bubble attachment with the CPU interface. Mechanical agitation can be provided in different ways. One is to impart vibration to the CPU itself, which can be achieved, by imparting an oscillatory movement of small amplitude to the CPU. The frequency of the movement does not need to be high, in the order of 5 Hz or slightly more to obtain a benefit. Objectively this is the least desirable option because of possible CPU durability concerns resulting from the oscillatory movement.

Another way to create mechanical agitation is to impart waves into the coolant. An ultrasonic generator 102 shown in FIG. 2 can accomplish this. The ultrasonic waves travelling in the body of liquid coolant interact with the bubbles adhering to the CPU interface and promote separation of the bubbles. The location of the ultrasonic generator in the main cooling chamber 12, the frequency of operation and the magnitude of the oscillations are design considerations within the reach of a person skilled in the art. Note that the high frequency waves in the coolant enhance the heat transfer from the CPU to the coolant in addition to reducing the bubbles adherence.

The ultrasonic generator can be designed to generate radiation having a variable intensity. The range of radiation energy can vary up to 3400 $Wm^2$.

Yet another way to provide mechanical agitation is to direct coolant jets at the CPU interface in order to create coolant flow to entrain the bubbles. Coolant jets can be placed in any suitable location and fed with pressurized coolant by a pump. The orientation of the jets should be such as to create a flow of coolant generally in the plane of the CPU interface to continuously 'wipe' the bubbles. Advantageously, the coolant so injected can be delivered directly from a heat exchanger, such that it is chilled and can further take heat away from the CPU interface.

The main cooling chamber 12 also includes a series of coolant flow management devices to assist with proper distribution of chilled coolant such as to enhance heat take-up from the CPU. The coolant flow management devices include a flow sparger 104 located immediately in front of the chilled coolant inlet 106. The flow sparger is a physical structure that distributes the flow of chilled coolant within the main cooling chamber more uniformly. The coolant flow management devices further includes a perforated plate that is located downstream the flow sparger 104, relative to the direction of chilled coolant from the inlet 106. The effect of the perforated plate is to reduce flow turbulence such that the flow becomes laminar.

Figure 6:
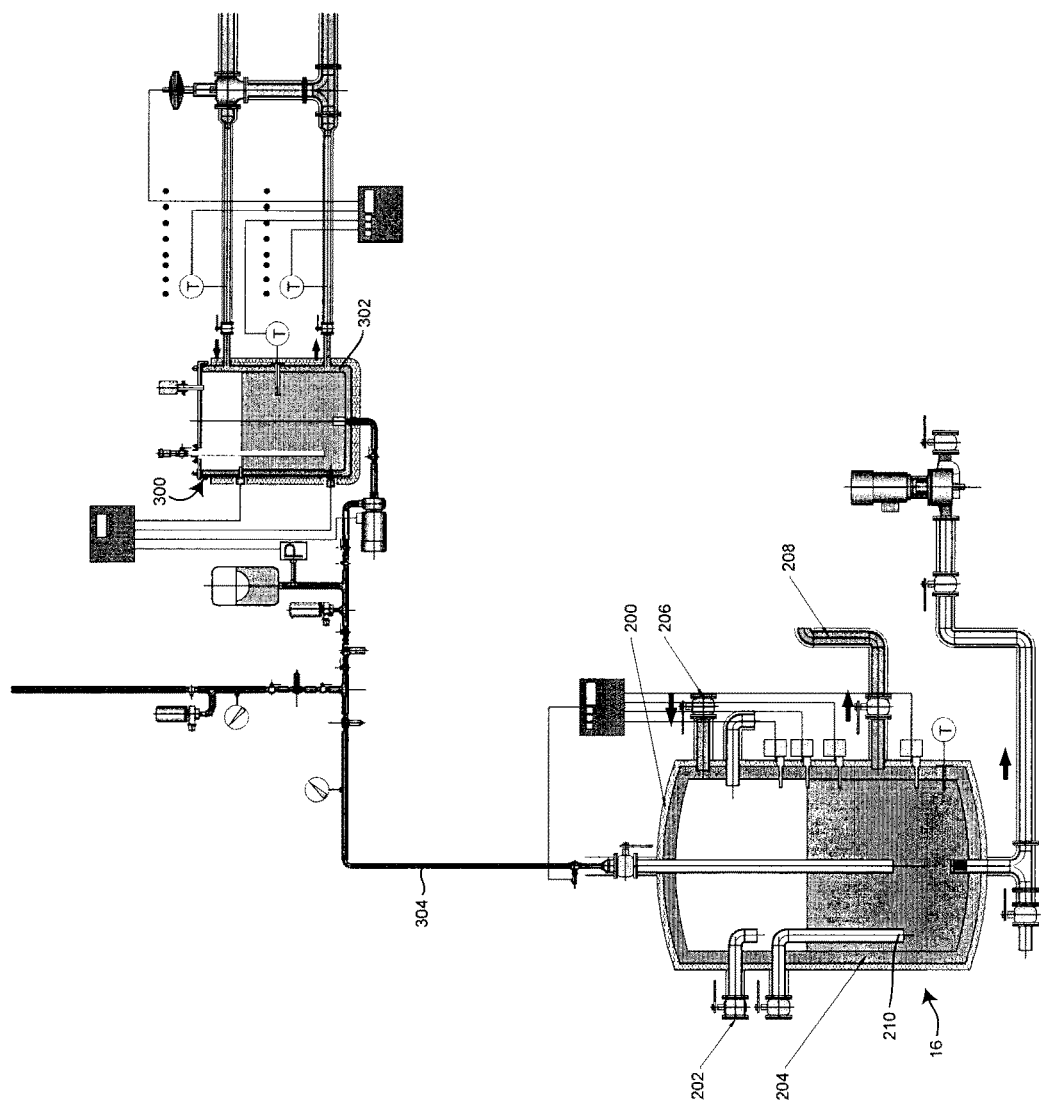
FIG. 6 is an enlarged view of the primary heat exchanger and the associated make-up tank of the cooling system in FIG. 1.

The primary coolant path includes a buffer tank section 16 illustrated in greater detail on FIG. 6. The buffer tank section 16 includes a tank 200 that receives hot coolant from the main cooling chamber 12 at the inlet 202. The tank 200 defines an enclosure that has the desired volume, which is provided with an outer cooling jacket 204. The jacket 204 is a pathway for secondary coolant to chill the primary coolant in the tank 200. It is preferred that the coolant in the buffer tank section 16 remain in a liquid state. As such, the cooling system 10 can rely on the buffer tank section 16 to provide sufficiently cool liquid when needed. The secondary coolant may be water or any other suitable medium.

As discussed earlier in connection with the main cooling chamber 12, the jacket 204 of cooling tank 200 may have different configurations. One possibility is to provide on the tank 200 a spiraled conduit in which secondary coolant flows and which is in thermal exchange relationship with the primary coolant. Yet another possibility is to create a continuous hollow space that completely encloses the tank 200 and which has the advantage of allowing for a greater secondary coolant volume to egress the jacket.

Secondary coolant flows through the jacket 204 by entering via an inlet 206 near the top of the tank 200 and leaving by an outlet 208 near the bottom of the tank 200. Chilled primary coolant is removed from the tank 200 by a pick up tube 210 that reaches near the bottom of the tank 200, where the chilled coolant accumulates in light of its higher density by comparison to the hot coolant. The chilled coolant is pumped back to the main cooling chamber 12 via a conduit and a pump arrangement leading to the inlet 106.

The buffer tank section 16 has a local make-up tank 300 to add primary coolant and compensate for loss due to evaporation. The local make-up tank 300, in addition to supplying coolant can also be designed to cool it. A secondary coolant jacket 302 through which flows secondary coolant such as water provides the cooling assist function.

A conduit 304 establishes a fluid communication between the local make-up tank 300 and the tank 200. By locating the secondary make-up tank 300 at a higher elevation than the tank 200, primary coolant will flow under the effect of gravity directly into the tank 200.

A possible option is to pressurize the local make-up tank 300 such that a high volume of chilled coolant can be injected into the tank 200 when the circumstances require it. In this example, the local make-up tank is sealed at the top and a pressurized air pocket is created on top of the liquid body. When the conduit 304 is opened, the added pressure assists expelling the primary coolant from the local make-up tank 300 to the tank 200.

The preferred option, however, is provide the conduit 304 with a pump for controlling of the flow of coolant.

To facilitate the heat transfer from the CPU surface to the liquid coolant it is possible to provide the CPU surface with a treatment or configuration facilitating bubble formation and bubble release. An example of such surface configuration is to create a porous layer that will increase the surface area of the CPU/coolant interface. The porosity and the thickness of the porous layer may vary. For instance, the pores are open pores to allow bubbles to escape. In addition, it is generally preferred to dimension the pores such that the average pore size is larger than the average bubble size. In this fashion, bubbles are less likely to become trapped in the porous network. Bubble formation may induce an isolation layer due to the fact that the heat transfer from the surface of the electronic module 18 is less through gas than through liquid. The bubble starts small and increases in size until the point where the force of differential density is larger than the force of adhesion of the bubble surface to the CPU surface. Hence the bubble should be carried away as fast as possible once created. Another feature of the porous layer is to increase the heat transfer coefficient, thereby increasing the heat flux at the CPU/coolant interface.

The porous network can have a random and generally uniform pore distribution or the pore distribution can be controlled to create a pore-size gradient. The pore size gradient is such that the pore size increases with the distance from the CPU surface. In other words, the pores that are closer to the CPU surface are the smallest and moving further away from the CPU the pores become increasingly larger. Small pores create a larger heat exchange surface and also provide more nucleation sites for bubble formation. As bubbles are created and released from the smaller pores, they travel through larger pores which owing to their size provide a larger escape pathway to prevent bubble trapping. The porosity gradient employed should allow for high heat transfer and ease of bubble extraction at the CPU/coolant interface.

The material used to make the porous network is thermally conductive. Metallic material is a material of choice. A porous network can be manufactured from copper by using the process described in the U.S. Pat. No. 6,660,224 entitled "Method for making open cell material" and assigned to the National Research Council of Canada.

The porous layer can be adhered to the surface of the CPU by using various techniques, such as by clamps that press the porous network against the CPU surface to increase the heat transfer potential, or using bonding components that, in addition to providing a mechanical attachment, create a pathway for heat to travel toward the porous network. Brazing is an example of such bonding component, which can be used to the extent the surface of the CPU, has a metallic coating on it.

An example of a surface treatment to facilitate bubble release, which can be applied to the CPU surface, the porous network surface or both, is a treatment to reduce the surface tension. Without intent of being bound by any particular theory, it is believed that a lower surface tension at the interface at which bubbles nucleate, facilitates bubble release. An example of a surface treatment to reduce the surface tension is to apply a surfactant. Again, the surfactant can be applied to the CPU surface, the porous network surface or both. The choice of the surfactant should take into consideration its compatibility with the primary coolant.

Since the primary coolant is in direct contact with the CPU and associated electrical components and connections, the coolant should be dielectric to prevent shorts circuits. The chemical sold by 3M under the trademark Novec is an example of liquid that has the necessary dielectric properties to be used in applications in which the coolant is in direct contact with the electronic circuitry.

The primary coolant liquid can be engineered with a specific boiling point at a temperature selected according to the cooling requirements. Since the phase transition from liquid to vapor takes-up a significant amount of energy, the boiling point is selected to be lower than the maximal operational temperature of the CPU. In other words, if the temperature of the CPU progressively increases, the coolant should start boiling before the point at which a critical temperature is reached and the CPU must be shut down or throttled down to prevent it from overheating. The temperature delta, which is the difference between the CPU critical temperature, which is considered to be the upper limit of its operational temperature range and the boiling point, should be according to the OEM specifications. It is however preferred that the boiling point of the primary coolant liquid be below the CPU critical temperature.

A possible refinement is to formulate the primary coolant in such a way that it provides phase transition from liquid to vapor at different temperatures. In a specific example, this can be achieved by mixing liquids having different boiling points. The family of Novec products referred to earlier can be engineered to provide a range of boiling points so it is a matter of selecting the proper liquid composition to provide the desired phase transition temperatures.

Coolant with multiple boiling points is preferred because it provides a more gradual thermal energy absorption than a liquid having a single boiling point. A single boiling point invokes a significant heat take-up mechanism and it is not a gradual process. It is rather a step process. With multiple boiling points the mechanism is more progressive. Albeit it still has a step-like nature, there are multiple steps so it is possible to operate between steps.

For example, the liquid coolant can be a mixture of two liquids of the Novec family having boiling points A and B respectively, where A is lower than B. As the temperature of the CPU increases, the liquid with boiling point A will undergo phase change and will provide an enhanced cooling action. The additional cooling may thus suffice to stabilize the CPU temperature. Should increased cooling be further required, the fraction of the coolant with boiling point B will start changing phase. At that point, both coolant fractions will be boiling.

In a specific example, the boiling points can be selected such as to straddle the operational temperature of the CPU. In other words, during steady state operation, the CPU is at a temperature that exceeds the boiling point A (which is assumed to the lowest) and that coolant fraction is boiling. The fraction having boiling point B (which is the highest) starts to change phase when a higher temperature is reached. As with the previous example, the boiling point B is at or slightly below the critical temperature such as to provide additional cooling before the temperature reaches a point where the CPU has to be shut down.

Another advantage of using coolant engineered with multiple boiling points is the capability of the fraction of the coolant that is still liquid to condensate at least in part the gaseous fraction. Since the difference of temperature between the boiling points can be significant, in the order of 10 degrees Celsius or more, the bubbles of the evaporating fraction have to travel through the liquid medium to reach the surface of the coolant body. That liquid medium has the ability to take up more heat, as its boiling point is higher. The cooling effect provided by the coolant that is still liquid on the vapor component may, in certain circumstances, suffice to completely condensate the vapor. Thus, little or no bubbles will break the surface.

The fractions having different boiling points may have the same density, in which case they will likely mix uniformly or different densities.

Different density cooling fractions can also be used when they have similar boiling points. In this situation, the body of coolant in the main cooling chamber 12 is stratified and there is a lower density fraction on top with a higher density fraction below. Assuming that the higher density fraction starts to boil first, the vapor will travel through the lighter density fraction and assuming this fraction is sufficiently cool, it will condensate at least in part the vapors.

Figure 7:
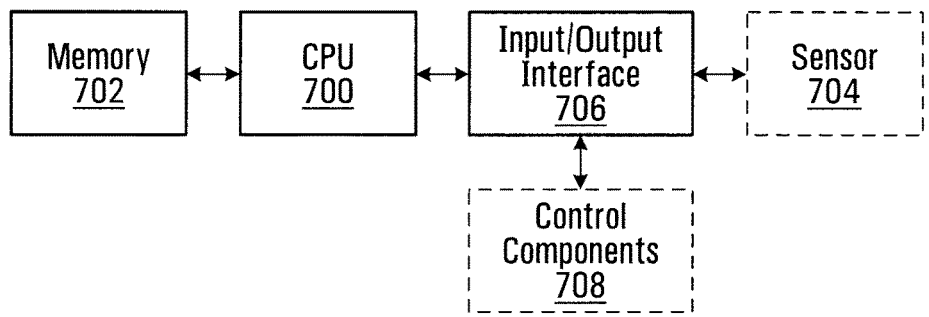
FIG. 7 is a block diagram illustrating a computing platform for executing software that implements a control system for the cooling system.

FIG. 7 is a block diagram illustrating the principal components of a control system to control the operation of the cooling system 10. Generally speaking, the control system includes a CPU 700 in communication with a machine-readable storage 702, commonly referred to as memory. The memory 702 stores program code for execution by the CPU 700. The program code defines the logic for controlling the operation of the cooling system 10. Also, the memory 702 stores data that is processed by the program code, such as data derived from the various sensors 704 of the cooling system 10. Examples of sensors include liquid level sensors, temperature sensors, flow sensors, etc. Thus, data generated from the sensors is stored in the memory 702 for subsequent use. For example, temperature sensors may communicate temperature readings from the electronic module 18 (or, alternatively, the liquid coolant) in order to derive heat generation information as will be discussed below. The software executed by the CPU processes the data stored in memory 702 in order to output control signals to control the cooling system 10. The control signals regulate the operation of control components 708 (i.e.: pumps, valves, piston level regulator, tank cover lifting gear, etc) as it will be discussed in greater detail below.

The control system also has an input/output interface 706 through which data generated by the various sensors 704 is communicated to the memory 702. In addition, the control signals generated by the CPU 700 are directed to the various control components 708 via the input/output interface 706.

Note that the CPU 700 is different from the CPU that is being cooled. This is a preferred mode of operation. In theory, the CPU that is cooled can also execute the code for controlling the cooling system 10 and thus provide the control functions, however this approach may not always work well since the CPU is essentially controlling itself. For instance, if an overheating condition arises and the CPU shuts itself down, the control function of the cooling system 10 also shuts down, which is undesirable.

To provide adequate cooling the control system needs to assess what the cooling requirements are. This can be done in two ways. The first way is a reactive way and the second is a pro-active way. The reactive way relies on measurement of certain parameters that indicate what the temperature of the CPU is and, in response to those parameters, the operation of the cooling system 10 is adjusted accordingly. This approach works well when the temperature of the CPU varies relatively slowly so there is sufficient reaction time. Also note that inherently, the cooling system 10 can rapidly absorb a certain amount of heat to compensate for a rapid heat rise of the CPU, without any action being taken. The liquid coolant in the main chamber is a large thermal buffer and in event of a rapid heat rise of the CPU, the coolant will immediately provide cooling by boiling or simply heat conduction to keep the temperature at a manageable level. This provides enough time for a control action to be implemented. A control action can be, for example, switching between different cooling modes, etc.

The temperature of the CPU can be assessed in a number of possible ways. The first is via a temperature sensor on the CPU. This provides a direct method of temperature measurement. Another possible way of measuring the temperature is by determining if the coolant starts boiling. Bubbles in the coolant combined to the lower density of the liquid body will increase the coolant level and constitute an indication that the temperature of the CPU has reached the boiling temperature of the coolant.

Figure 9:
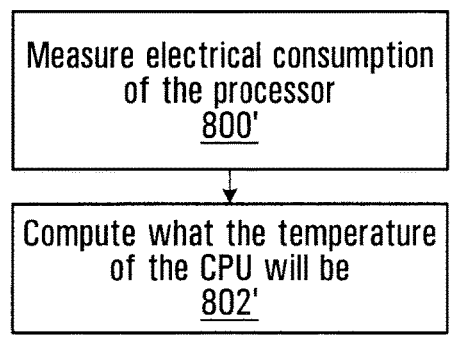
FIG. 9 is a flowchart of a process for computing what the temperature of the CPU will be on the basis of the electrical power consumption of the CPU.
Figure 10:
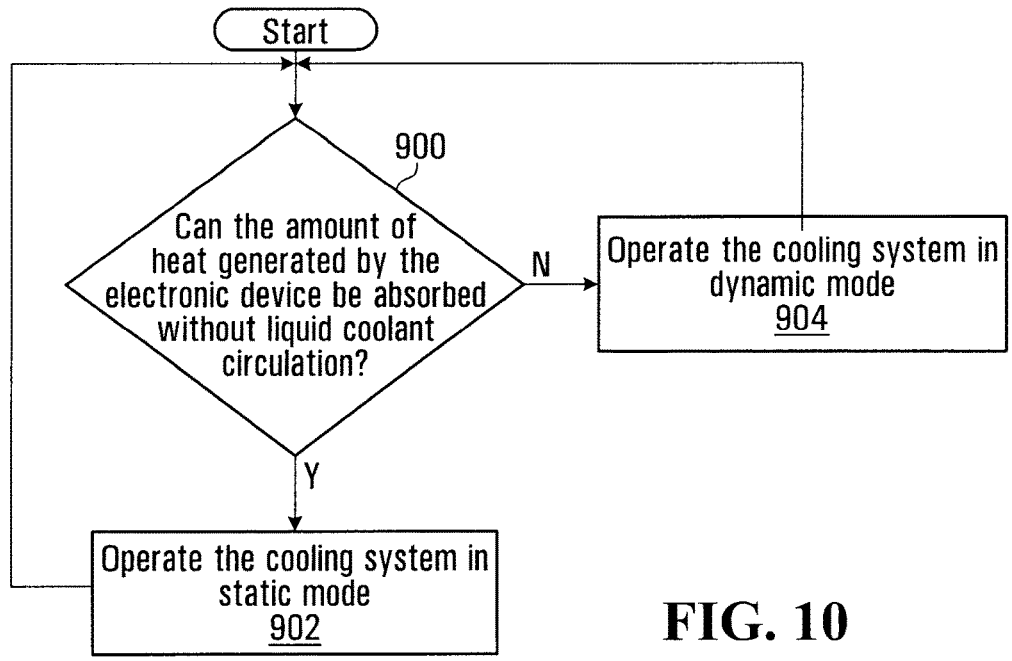
FIG. 10 is a flowchart illustrating the process for selecting between different operational modes of the cooling system.

Yet another method to derive the CPU temperature is to observe the power consumption of the CPU, as shown at FIG. 9, in particular at steps 800' and 802'. Since the power consumption is directly tied to the temperature of the device, the amount of electrical power is a good indicator of how hot the CPU is. Note that the power consumption is essentially a predictor of the CPU temperature as it takes some time for the temperature of the CPU to rise when a certain power consumption level has been reached. In that sense, the power consumption is an indicator of what the temperature will be a certain amount of time after the observation.

Figure 8:
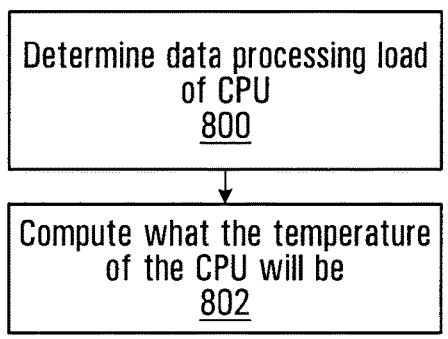
FIG. 8 is a flowchart of a process for computing what the temperature of the CPU will be on the basis of the data processing load of the CPU.

Yet another possibility is to correlate the data processing load of the CPU to its temperature, as shown at FIG. 8, in particular at steps 800 and 802. This is somewhat similar to the electrical consumption in the sense that the larger the data processing load, the hotter the CPU gets. Accordingly by observing the data processing load, it is possible to predict when the CPU will get at a certain temperature point.

The data processing load is fairly simple to measure since the operating system that manages the CPU can report this information.

When relying on power consumption or on data processing load to predict the temperature a mathematical model is used which correlates all the various parameters together. The mathematical model essentially takes as an input the current temperature of the CPU and the observed data load or power consumption and computes a relation between time and the thermal energy to be removed from the CPU in order to keep the CPU well within its operational boundaries.

The mathematical model also takes into consideration the thermal removal ability of the cooling system 10 at various modes of operation. Therefore, the mathematical model can pro-actively adjust the mode of operation depending on the cooling requirements.

For certain applications, the mathematical model can be complex because it takes into consideration heat production phenomena and also heat dissipation phenomena. A practical way to build the model is through testing. This can be done by operating the CPU at various data processing loads or power consumption levels and for each level determining the amount of heat absorbed by the coolant to keep the CPU at a predetermined temperature. Transient characteristics such as the lag time between the heat rise and the switch to a certain power consumption or data load level can also be determined by this practical test.

The mathematical model can thus be used to match the predicting condition, i.e. the power consumption of data load processing to a particular operational mode of the cooling system 10 that provides the cooling requirements the model computes for the CPU.

The cooling system 10 has at least two different operational modes. The modes distinguish from one another on the basis of cooling capacity. A first mode of operation is a static mode of operation. In this mode, the primary coolant takes up heat from the CPU by conduction and that heat is transferred, also by conduction to the jacket 24. The primary coolant is not circulated outside the main cooling chamber 12. Typically, this mode of operation is suitable for situations where the CPU operates at low power levels and generates little heat. The static mode of operation also consumes little electrical energy since fewer components need to be operated by comparison to other modes providing increased cooling capacities.

The second mode of operation is a dynamic mode where the coolant from the main cooling chamber 12 is circulated to the throughout the coolant path. The dynamic mode has a higher cooling capacity than the static mode.

FIG. 9 illustrates the process steps performed by the software logic to determine which mode of operation should be used.

Step 900 in the flowchart is a decision step that determines if the cooling requirements of the CPU can be met by the cooling capacity in the static mode. To perform the assessment, the mathematical model can be used to predict the cooling requirements of the CPU, in terms of amount of heat that needs to be extracted by the primary coolant. The software will measure the electrical consumption of the CPU or receive data indicating what the data processing load is. The mathematical model computes the corresponding cooling requirements. If the static mode suffices to meet those requirements the processing logic proceeds to step 902, which designates the various control actions necessary to maintain the cooling system 10 in the static mode of operation.

The assessment performed at step 900 is constantly repeated. When the heat generation capacity of the CPU is stable, the mode of operation of the cooling system 10 does not change. However, if suddenly the CPU processing requirements change significantly, the mathematical model predictions may also change and trigger the switch to another mode of operation of the cooling system 10. For example, if the CPU data processing load is rapidly raised, the mathematical model predicting the heat generation behavior computes that the static mode of operation is no longer sufficient and triggers the dynamic mode of operation. In this instance, the processing branches to step 904 where the control signals cause the cooling system 10 to operate in the dynamic mode. Specifically, the control signals trigger the various pumps and valves such that primary coolant is circulated from the main cooling tank through the entire primary coolant circulation path including the buffer tank section 16.

In the process above, the ability of the mathematical model to predict cooling requirements allows the cooling system 10 to anticipate the cooling needs and switch modes even before the predicted heat generation level has been reached.

Note that in the above example, the cooling system 10 has been described in terms of discrete modes of operation. A possible variant is to operate the cooling system 10 in a continuously variable fashion to progressively vary the cooling capacity to meet the cooling requirements. For example, the cooling system 10 is designed to constantly circulate the primary coolant from the main cooling tank throughout the primary coolant path, including the buffer tank section 16. A change of mode in this example is considered an operational change that allows the cooling system 10 to absorb more heat. For example, such operational change can be an increase in the flow rate of primary coolant through the coolant path, so effectively the cooling system 10 operates in a different mode.

Changing the level of coolant in the main cooling chamber 12 can also vary the operational mode of the cooling system 10. This is performed by generating control signals from the input/output interface 706 to the electric drive 94 to displace the piston 96. When additional cooling is required, the logic module thus commands the drive 94 to turn the jackscrew 92 such that the piston 96 is downwardly displaced, expelling coolant from the cylinder 90 into the main cooling chamber 12 and thus raising the level of primary coolant in the main cooling chamber 12.

Figure 14:
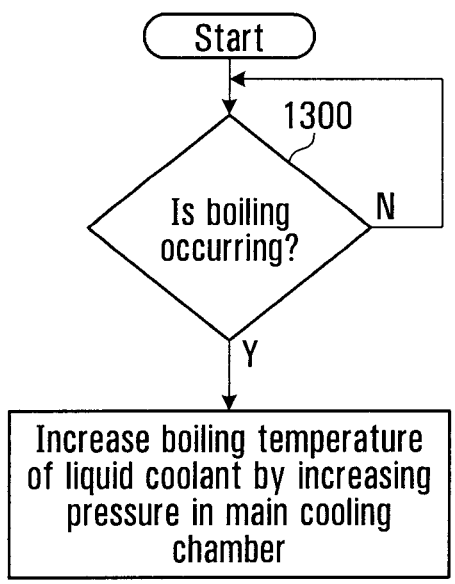
FIG. 14 is a flowchart illustrating a process for regulating the boiling point of the primary coolant.

Varying the boiling temperature in the main cooling chamber 12 is yet another possible way of modifying the operational mode of the cooling system 10. Varying the pressure in the main cooling chamber 12 alters the boiling temperature. The flowchart at FIG. 14 illustrates this process. Assume that the primary coolant starts boiling but from an operational standpoint it is desirable to increase the boiling point and thus delay the phase change process. At step 1300 the logic determines if boiling is now occurring. In the affirmative, the processing moves to step 1302 where the control system increases the pressure in the main cooling chamber 12 which has the effect of increasing the temperature at which the phase change will be occurring. A pressure increase in the main cooling chamber 12 assumes that the primary cooling path can be pressurized. Such pressurization can be accomplished by injection of inert gas from a pressurized source. For instance, the control system outputs a control signal from the input/output interface 706 to a gas valve to direct the valve to open and inject inert gas in the main cooling chamber 12. The valve closes when the desired pressure in the main cooling chamber is reached.

The control system logic is also provided with a series of modules that can sense alarm conditions and notify an operator or perform a certain number of actions automatically in order to prevent damage to the CPU.

The logic works by processing the outputs of various sensors to read in real time the parameters of operation of the cooling system 10. More specifically, the logic will read temperature, pressure and flow rate information at various locations in the cooling system 10 and it will compare them to predetermined settings to determine if the cooling system is operating within normal parameters or an abnormal condition is developing.

In a specific example, the logic will read the outputs of level sensors that measure the level of primary coolant in the main cooling chamber 12. The level of primary coolant in the main cooling chamber 12 is not expected to vary much, except if there is a leak in the system. Some variation is expected as a result of evaporation of the primary coolant or when the primary coolant starts to boil which will have the effect of a slightly increasing its volume, hence its level. If the logic determines that the level has dropped below a certain threshold, it can automatically replenish the main cooling chamber 12 by generating a control signal to the electric valve 86 to allow primary coolant in the make-up tank 70 to flow to the main cooling chamber 12.

Similarly, the logic also monitors the level of primary coolant in the buffer tank 200. If the level drops below a certain point until a control signal is generated to an electric valve to allow primary coolant from the make-up tank 300 to flow into the buffer tank 200 and the raise the level of primary coolant to its normal level.

The make-up tank 300 can also be used in emergency conditions to inject additional primary coolant such as to increase the cooling capacity. This action may be performed even if the level of primary coolant in the buffer tank 200 is at its normal level. The fast transfer of a primary coolant from the make-up tank 300 allows increasing the overall primary coolant volume, hence providing additional cooling capacity in certain circumstances. Example of such circumstances include situations where there may be a leak in the system and emergency cooling is required to prevent the CPU from overheating.

The emergency transfer of primary coolant from the make-up tank into the buffer tank 200 can be triggered as a result of a low level of primary coolant in the heat exchanger tank 200, excessive temperature of the primary coolants or any other condition that indicates a risk of overheating.

In order to allow a quick transfer of primary coolant from the make-up tank 300 to the buffer tank 200 a pump may be used to transfer the liquid or the make-up tank 300 can be pressurized to cause the primary coolant in the make-up tank 300 to be expelled when a valve is opened.

When certain emergency conditions arise such as for example a rapid rise of the temperature of the CPU the logic is programmed to automatically take certain actions at the CPU level in order to prevent the possibility of damage. One example is to completely shut down the CPU. This is an extreme measure that is to be avoided as much as possible, since shutting down the CPU will interrupt all data processing activity. If the CPU is working on some critical functions the loss of the data processing capacity may be a significant downside. Still, that possibility is preferred over the alternative where the CPU is damaged and needs to be replaced.

Figure 11:
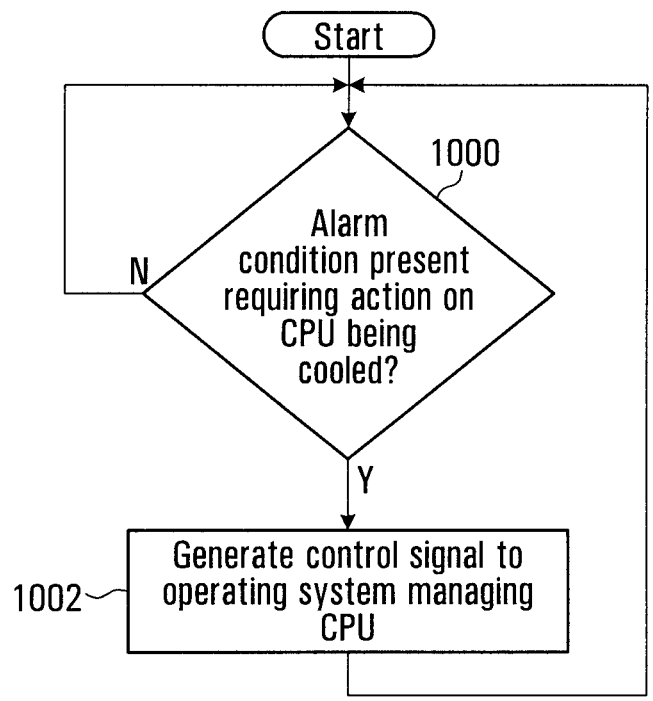
FIG. 11 is a flowchart illustrating a process for controlling the CPU operation on the basis of the cooling capacity of the cooling system.

FIG. 11 illustrates the process in general. At step 1000, the logic determines if an alarm condition which requires a control action at the CPU level is present. If such control action is necessary, it is generated at step 1002 and output via the input/output interface 706. As discussed below, the control action can be a command to shut down the CPU or to reduce the data processing load on the CPU.

The shutting down of the CPU is done by generating a control signal via the input-output interface 706, which is directed as an input to the operating system managing the CPU. In response to this input, the operating system will immediately terminate all processing activity and allow the CPU to cool down before it is brought back online.

A refinement to the approach described above is to allow the logic of the control system to throttle the CPU and thus control the rate of heat generation in order to match it to the cooling capacity. This allows proactively reducing the data processing load on the CPU and avoiding the necessity to shut it down completely. In a specific example, the logic monitors the state of the various sensors and if it determines that the temperature of the CPU is raising it will, as discussed earlier trigger certain number of actions to increase the cooling capacity. Should the temperature continue to rise beyond the point were the cooling capacity is at its maximum, which may occur if there is some fault in the cooling system, the logic determines that the data-processing load on the CPU needs to be reduced in order to match the generated heat with the currently available cooling capacity.

The logic module will generate via the input-output interface 706 a control signal that is directed to the operating system managing the CPU to indicate to the operating system that the data-processing load on the CPU is to be reduced. The degree of reduction of the data processing load is determined on the basis of the available cooling capacity. The logic module of the control system can compute the currently available cooling capacity and determine on that basis how much data processing load is allowable without exceeding that capacity. A simple method of implementation is to provide the logic with a lookup table that matches different cooling capacities with the different data processing loads. It is thus a simple matter for the logic to map the currently available cooling capacity with the corresponding data processing load and to generate the control signal to the operating system to bring the CPU down to the desired data processing load. The control signal could convey the desired data processing load such that the operating system can enforce it. Optionally, the computation of the allowable data processing load for the CPU can be performed at the operating system level. The control signal therefore would only convey the currently available cooling capacity and lets the operating system determine what the processing load should be in order to avoid exceeding that cooling capacity.

In addition to controlling the operation of the cooling system, the logic module also monitors the condition of the primary coolant to determine if it is still fit for continued operation. In the event its condition is not satisfactory, the logic module can notify the operator such that the coolant can be replaced.

One parameter of the primary coolant that is being monitored is its dielectric constant. Since the CPU and the associated electronic equipment is in direct contact with the primary cooling liquid, the coolant has to have a sufficient dielectric capability to prevent short-circuits. The dielectric capability of the liquid medium can change over time for various reasons. For instance, the primary coolant can undergo a progressive chemical change that has the effect of reducing its dielectric constant. Another reason is a presence of impurities. The Novec family of engineered liquids can act as solvents, thus solving impurities that may be present in the primary coolant path. When the impurities enter in suspension and are distributed throughout the liquid mass they may increase the conductivity of the liquid. Accordingly, over time, the conductivity of the primary coolant can increase sufficiently to a point where it may allow some degree of electrical conduction between conductive terminals of the electronic module 18 that is immersed in the coolant. To avoid this problem, the primary coolant is monitored for sufficient insulation capacity and in the event it is found to be somewhat conductive, it is replaced.

The logic module will monitor the dielectric constant of the primary coolant via a sensor. Different types of sensors can be used without departing from the spirit of the invention. One example is to use a sensor which directly measures the dielectric constant of the primary coolant. Such sensors operate on different principles, one being a capacitor type arrangement where an electric field is established between two plates which are spaced apart, the area between the plates being filled with coolant. Another example is to directly measure the conductivity of the liquid (electrical resistance measurement).

Advantageously, the insulation capacity of the primary coolant is monitored constantly. This allows determining in real time if the primary coolant can continue to provide the desired level of dielectric protection. Should a problem be identified, the logic module can trigger an alarm to indicate that a replacement of the primary coolant is required.

For that purpose, the logic module contains predetermined operational limits for the conductivity or dielectric constant of the primary coolant which cannot be exceeded.

These limits are thresholds and as the measured conductivity or dielectric constant gets closer to them the severity of the alarm condition is increased. This allows the operator to plan ahead in performing the desired maintenance to avoid unplanned shutdowns.

Another possible refinement is for the logic module to determine trends in the increase of the conductivity or reduction in the dielectric constant of the primary coolant such as to be able to predict when a primary coolant replacement will need to be done. The trend determination is done by collecting a series of conductivity or dielectric constant measurements over time. The rate of change of these parameters allows determining when the thresholds will be reached. For example, assume that the cooling system is in operation for six months and the conductivity of the primary coolant has reached 50% of the allowable limit. The system can then predict that the threshold will be reached within the next six months.

The logic can thus notify the operator in a predictive manner that the useful life of the primary coolant will be spent in a predictable timeframe. In this fashion, the operator can see the amount of time left before a primary coolant change needs to be performed.

The alarm itself can be directed to an operator console (not shown in the drawings). The different alarm conditions can be designated in different ways on a GUI interface, the most urgent ones being shown in red while advisories are shown in a different color. In terms of implementation, the control signals generated by the input-output interface 706 are directed to a display device, which in this example constitutes the operator console, to be displayed. In the case of the primary coolant life counter, information could be displayed in a display field of the GUI in terms of amount of time left, percentage of life spent or in any other way.

Figure 12:
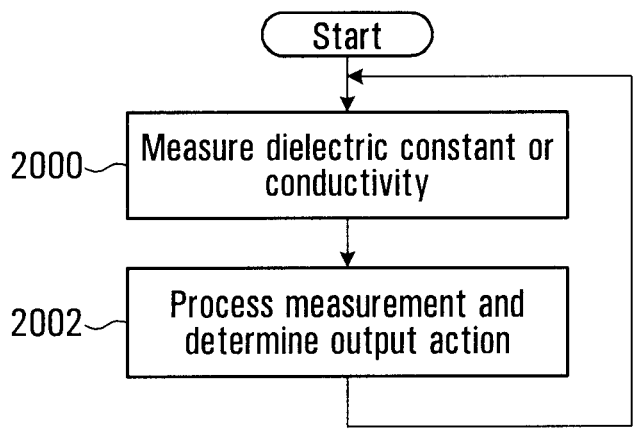
FIG. 12 is a flowchart illustrating a process for determining the conductivity of the primary cooling liquid.

The flowchart at FIG. 12 illustrates the above process. At step 2000 the dielectric constant or conductivity of the primary coolant is measured. The results of the measurement are processed at step 2002 to determine the type of action required. The processing step 2002 designates the comparison of the measurements with thresholds to determine if an alarm condition is to be generated and in the affirmative the severity of the alarm condition. The output action shown in the flowchart can also include an indication on an operator console of the computed remaining life of the primary coolant and prediction as to when it will need to be changed.

The logic module also analyzes the primary coolant for proper cooling capacity. Over time, as the chemical composition of the primary coolant may slightly change, the change can affect the ability of the coolant to absorb thermal energy. The phenomena can, in turn alter the cooling capacity of the system. For that reason, the logic module measures the cooling capacity and should that cooling capacity fall below a threshold, an alarm is raised to notify the operator that the primary coolant needs to be replaced. The cooling capacity can be determined in indirectly. This can be done by placing in the fluid path of the primary coolant a heat source such as an electric filament in a spaced apart relationship with a thermal sensor.

The response of the thermal sensor to a predetermined thermal excitation produced by the heat source when the primary coolant is fresh is known. The response essentially represents the ability of the liquid medium to channel heat. As the primary coolant ages, that response will change and the change indicates a loss of cooling capacity. The same approach described above in connection with the conductivity or the electric constant of the primary coolant can be used to generate alarm conditions indicating to the operator that the liquid is undergoing cooling capacity loss and may need to be replaced. The logic module compares the determined cooling capacity to thresholds and if they are exceeded, an alarm is raised, trends can also be computed based on variations in cooling capacity to predict when the primary coolant needs to be changed. Control signals issued by the control system are displayed on the operator console to indicate the amount of time left before coolant replacement is required.

Figure 13:
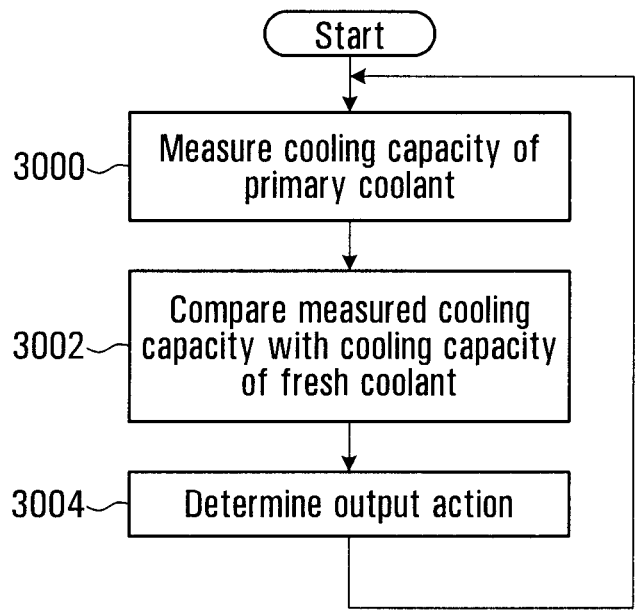
FIG. 13 is a flowchart illustrating a process for determining the cooling capacity of the primary cooling liquid.

The flowchart in FIG. 13 generally illustrates this process. At step 3000 the cooling capacity of the primary coolant is determined. At step 3002, the results are compared to the cooling capacity of fresh coolant. Step 2004 determines the proper action to take depending on the deviation. The action can be an alarm condition or computing an approximation of the remaining life of the primary coolant.

The invention claimed is:

1. A system for cooling a CPU, comprising:
   a. a tank for holding dielectric coolant in a liquid phase and for receiving the CPU that is immersed in the coolant, said coolant having a first fraction and a second fraction, the first fraction having a different boiling point from the second fraction;
   b. a cover for closing the tank;
   c. an electric pathway through the cover for communicating data signals to the CPU.

2. A system as defined in claim 1, wherein the electric pathway conveys data signals and electric power signals.

3. A system as defined in claim 2, wherein the tank is a first tank, the system including a second tank for holding dielectric coolant in fluid communication with the first tank.

4. A system as defined in claim 3, including a control device for adjusting a level of dielectric coolant in the first tank.

5. A system as defined in claim 4, wherein the control device for adjusting a level of dielectric coolant is responsive to a sudden loss of dielectric coolant from the first tank.

6. A system as defined in claim 5, wherein the control device for adjusting a level of dielectric coolant is responsive to an increase in cooling demand for the CPU to introduce an additional volume of dielectric coolant in the first tank.

7. A system as defined in claim 4, including a device for creating coolant flow in the first tank.

8. A system as defined in claim 7, wherein the device for creating coolant flow in the first tank includes a pump.

9. A system as defined in claim 7, wherein the device for creating coolant flow in the first tank operates in response to an increase in cooling demand for the CPU.

10. A system as defined in claim 9, wherein the device for creating coolant flow has a first and a second mode of operation, in the second mode of operation the device for creating coolant flow flowing more coolant than in the first mode of operation.

11. A system as defined in claim 10, wherein the first mode of operation is a static mode of operation wherein the device for creating coolant flow is not operating.

12. A system as defined in claim 1, including a device for facilitating release of bubbles of dielectric coolant from a surface of the CPU.

13. A system as defined in claim 12, wherein the device for facilitating release of bubbles provides a Venturi effect.

14. A system as defined in claim 12, wherein the device for facilitating release of bubbles includes a sound wave generator.

15. A system as defined in claim 12, wherein the device for facilitating release of bubbles imparts movement to the CPU.

16. A system as defined in claim 15, wherein the movement is an oscillatory movement.

17. A system as defined in claim 12, wherein the device for facilitating release of bubbles creates jets of dielectric coolant against the CPU.

18. A system as defined in claim 1, including a cooling path for circulating the second coolant in thermal transfer relationship with the tank.

19. A system as defined in claim 18, wherein the cooling path is in thermal transfer relationship with the cover.

\* \* \* \* \*